United States Patent
Ernoux

(10) Patent No.: US 9,502,973 B2
(45) Date of Patent: Nov. 22, 2016

(54) BUCK CONVERTER WITH III-NITRIDE SWITCH FOR SUBSTANTIALLY INCREASED INPUT-TO-OUTPUT VOLTAGE RATIO

(75) Inventor: Stephane Ernoux, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 600 days.

(21) Appl. No.: 12/384,794

(22) Filed: Apr. 8, 2009

(65) Prior Publication Data
US 2010/0259186 A1  Oct. 14, 2010

(51) Int. Cl.
| | | |
|---|---|---|
| H02M 3/155 | (2006.01) | |
| H03K 17/567 | (2006.01) | |
| H03K 17/74 | (2006.01) | |
| H02M 3/158 | (2006.01) | |
| H02M 3/156 | (2006.01) | |

(52) U.S. Cl.
CPC .......... *H02M 3/155* (2013.01); *H03K 17/567* (2013.01); *H03K 17/74* (2013.01); *H02M 3/156* (2013.01); *H02M 3/158* (2013.01)

(58) Field of Classification Search
CPC .................. H02M 3/156; H02M 3/158; H02M 3/1582; H02M 3/155
USPC .............. 323/282, 284, 224, 271, 222, 311; 363/37, 124, 126, 127
See application file for complete search history.

(56) References Cited

U.S. PATENT DOCUMENTS

| | | | | |
|---|---|---|---|---|
| 5,057,990 A | * | 10/1991 | Gulczynski | H02M 3/1582 323/350 |
| 5,488,269 A | * | 1/1996 | El-Hamamsy | H02M 1/4241 315/209 R |
| 5,507,990 A | * | 4/1996 | Bookbinder et al. | 264/143 |
| 6,694,438 B1 | * | 2/2004 | Porter et al. | 713/300 |
| 7,026,797 B2 | | 4/2006 | McCune | |
| 7,109,582 B2 | * | 9/2006 | Matsuoka | 257/724 |
| 7,230,405 B2 | | 6/2007 | Jang | |
| 7,550,781 B2 | | 6/2009 | Kinzer | |
| 7,667,986 B2 | * | 2/2010 | Artusi et al. | 363/16 |
| 7,813,149 B2 | * | 10/2010 | Popescu | H02M 1/44 363/21.05 |
| 2006/0175627 A1 | | 8/2006 | Shiraishi | |
| 2006/0198173 A1 | * | 9/2006 | Rozman | 363/123 |
| 2008/0012540 A1 | * | 1/2008 | Chen | H02M 1/38 323/224 |
| 2008/0084197 A1 | | 4/2008 | Williams | |

(Continued)

FOREIGN PATENT DOCUMENTS

| | | |
|---|---|---|
| EP | 1965433 A2 | 9/2008 |
| JP | 2004281454 | 10/2004 |
| TW | M346217 | 12/2008 |

*Primary Examiner* — Jue Zhang
*Assistant Examiner* — Lakaisha Jackson
(74) *Attorney, Agent, or Firm* — Slater Matsil, LLP

(57) ABSTRACT

According to one exemplary embodiment, a buck converter for converting a high voltage at an input of the buck converter to a low voltage at an output of the buck converter includes a III-nitride switch interposed between the input and the output of the buck converter and a low resistance switch interposed between the output of the buck converter and a ground. The buck converter further includes a control circuit configured to control a duty cycle of the III-nitride switch. The III-nitride switch has a sufficiently high switching speed so as to allow a ratio of the input high voltage to the output low voltage of the buck converter to be substantially greater than 10.

15 Claims, 3 Drawing Sheets

(56) References Cited

U.S. PATENT DOCUMENTS

| | | | |
|---|---|---|---|
| 2008/0122418 A1* | 5/2008 | Briere et al. | 323/282 |
| 2008/0136390 A1* | 6/2008 | Briere | 323/282 |
| 2008/0191216 A1* | 8/2008 | Machida | H01L 25/18 257/76 |
| 2008/0232119 A1* | 9/2008 | Ribarich | H05K 1/0206 362/373 |
| 2008/0237632 A1 | 10/2008 | Kinzer | |
| 2008/0253151 A1 | 10/2008 | Bahramian | |
| 2008/0265851 A1 | 10/2008 | Zhang | |
| 2008/0278985 A1* | 11/2008 | Ribarich | H03F 3/217 363/127 |
| 2009/0180304 A1* | 7/2009 | Bahramian et al. | 363/124 |
| 2009/0278513 A1 | 11/2009 | Bahramian | |

* cited by examiner

BUCK CONVERTER WITH III-NITRIDE SWITCH FOR SUBSTANTIALLY INCREASED INPUT-TO-OUTPUT VOLTAGE RATIO

DEFINITION

In the present application, "III-nitride refers to a compound semiconductor that includes nitrogen and at least one group III element such as, but not limited to, GaN, AlGaN, InN, AlN, InGaN, InAlGaN and the like."

BACKGROUND OF THE INVENTION

1. Field of the Invention

The present invention is generally in the field of electrical circuits. More particularly, the invention is in the field of voltage conversion circuits.

2. Background Art

Buck converters are commonly utilized to convert a high DC voltage to a low DC voltage. A buck converter typically includes a switch disposed between an input and an output of the buck converter (also referred to as a "high-side switch" in the present application), and a switch disposed between the output of the buck converter and a ground (also referred to as a "low-side switch" in the present application). The buck converter can include a control circuit to appropriately control the duty cycles of the high-side and low-side switches so as to convert a high input voltage to a low output voltage. For a buck converter to achieve a desirably high conversion ratio of input voltage to output voltage, the high-side switch needs to operate at a sufficiently low percent duty cycle. However, the duty cycle of the high-side switch is limited by its switching speed.

In a conventional buck converter, a high voltage silicon field effect transistor (FET), such as a high voltage metal oxide semiconductor FET (MOSFET), can be utilized for each of the high-side and low-side switches. However, as a result of a limitation in the switching speed of the high voltage silicon FET, it can be difficult for a conventional buck converter to achieve a conversion ratio (i.e. the ratio of input voltage to output voltage) that is much greater than approximately 10.0. As a result, two or more conventional buck converter stages can be required to convert a high DC voltage, such as approximately 310.0 volts, to a significantly lower DC voltage required to drive a particular load, thereby significantly increasing cost.

SUMMARY OF THE INVENTION

Buck converter with III-nitride switch for substantially increased input-to-output voltage ratio, substantially as shown in and/or described in connection with at least one of the figures, and as set forth more completely in the claims.

DETAILED DESCRIPTION OF THE INVENTION

The present invention is directed to a buck converter with III-nitride switch for substantially increased input-to-output voltage ratio. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
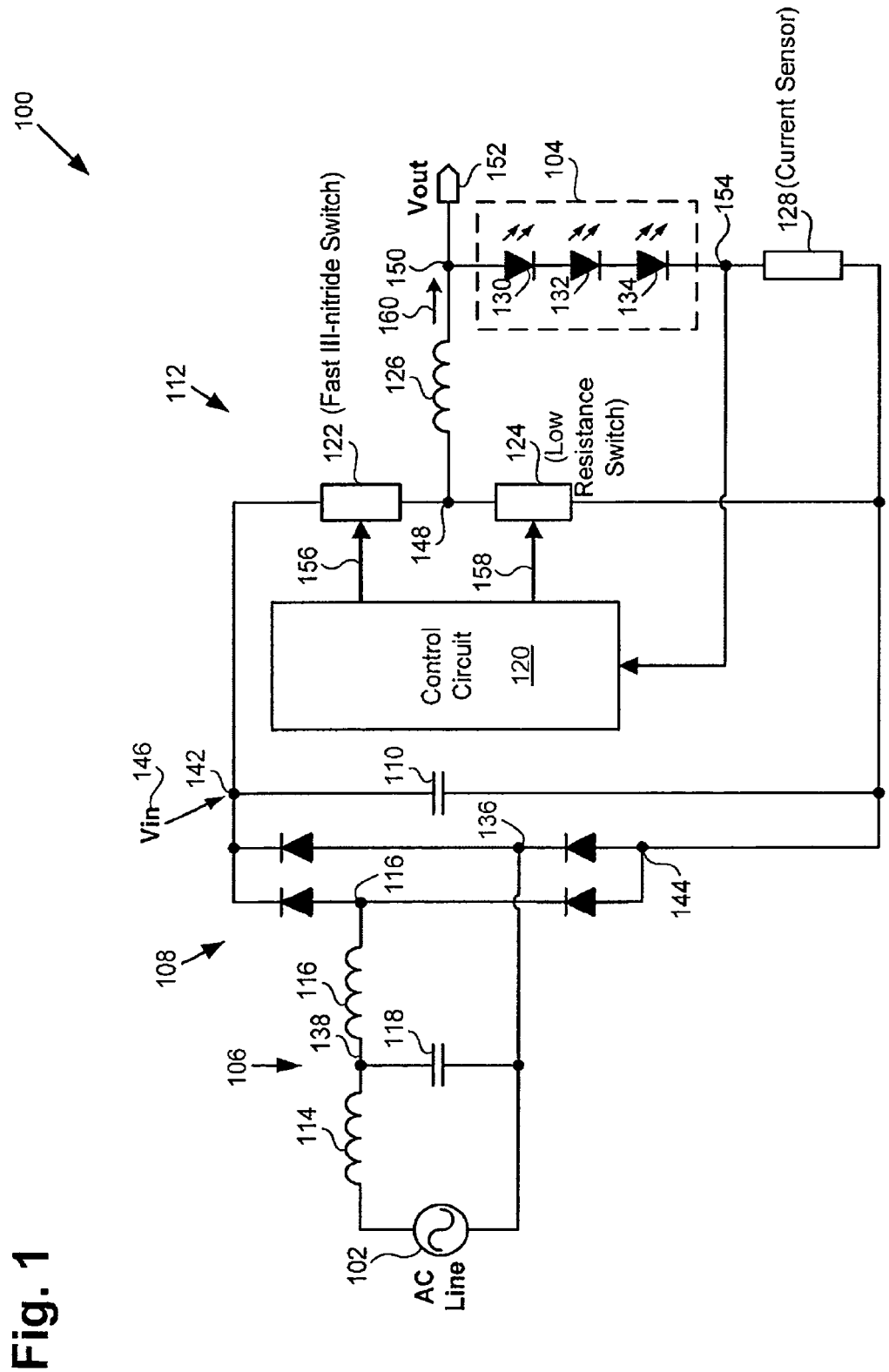
FIG. 1 illustrates a circuit diagram of an exemplary voltage conversion circuit including an exemplary buck converter in accordance with one embodiment of the present invention.

FIG. 1 shows a circuit diagram of an exemplary voltage conversion circuit coupled between an AC power source and a load in accordance with one embodiment of the present invention. Voltage conversion circuit 100 is coupled between AC power source 102, such as an AC line, and load 104 and includes electromagnetic interference (EMI) filter 106, full bridge rectifier 108, capacitor 110, and buck converter 112. EMI filter 106 includes inductors 114 and 116 and capacitor 118; and buck converter 112 includes control circuit 120, fast III-nitride switch 122, low resistance switch 124, inductor 126, and current sensor 128. Load 104, which includes series-coupled LEDs 130, 132, and 134, can be a current-driven load in an embodiment of the present invention. In one embodiment, load 104 can be a voltage-driven load, which can be a microprocessor or digital signal processor, for example. In another embodiment, load 104 can include one or more series-coupled LEDs, such as LEDs 130, 132, and 134.

As shown in FIG. 1, AC power source 102 is coupled across a first terminal of inductor 114 and a first AC input of full-bridge rectifier 108 and a first terminal of capacitor 118 at node 136, a second terminal of inductor 114 is coupled to a first terminal of inductor 116 and a second terminal of capacitor 118 at node 138, and a second terminal of inductor 116 is coupled to a second AC input of full-bridge rectifier 108 at node 140. AC power source 102 can provide, for example, between approximately 110.0 volts AC and approximately 120.0 volts AC in an embodiment of the invention. In another embodiment, AC power source 102 can provide approximately 220.0 volts AC. EMI filter 106, which includes inductors 114 and 116 and capacitor 118, forms a low pass filter for filtering high frequency interference.

Also shown in FIG. 1, a first terminal of capacitor 110 is coupled to a positive output of full-bride rectifier 108 at node 142 and a second terminal of capacitor 110 is coupled to a negative output of full-bridge rectifier 108 at node 144, which also provides a ground for voltage conversion circuit 100. Capacitor 110 can provide filtering for unregulated DC voltage outputted by full-bridge rectifier 108 at node 142, which also forms an input of buck converter 112. In an embodiment of the invention, full-bridge rectifier 108 can receive an AC voltage of approximately 120.0 volts from AC power source 102 and provide approximately 170.0 volts DC at node 142 (i.e. the input of buck converter 112). In an embodiment in which AC power source 102 provides approximately 220.0 volts AC, full-bridge rectifier 108 can provide approximately 310.0 volts DC at node 142. As shown in FIG. 1, input voltage (Vin) 146 corresponds to the DC voltage inputted into buck converter 112 at node 142.

Further shown in FIG. 1, a first terminal of fast III-nitride switch 122 is coupled to node 142 (i.e. the input of buck inverter 112), a second terminal of fast III-nitride switch 122 is coupled to a first terminal of inductor 126, which can be a buck inductor, and a first terminal of low resistance switch 124 at node 148, and a second terminal of low resistance switch 124 is coupled to a negative output of full-bridge rectifier 108 at node 144 (i.e. ground). Fast III-nitride switch 122 is a high voltage device that can be optimized to provide a very high switching speed. For example, III-nitride switch 122 can switch from an off-state to an on-state and vice versa in nanoseconds in an embodiment of the invention.

Fast III-nitride switch 122 can comprise, for example, a silicon transistor coupled with a depletion-mode (D-mode) III-nitride device and a silicon diode, such as Schottky diode, coupled across the silicon transistor in an embodiment of the invention. The silicon transistor can be configured so as to cause the D-mode III-nitride device to operate in an enhancement mode (E-mode). The silicon transistor can be, for example, a low voltage silicon FET, such as a low voltage silicon MOSFET. The D-mode III-nitride device can comprise a III-nitride compound semiconductor. The D-mode III-nitride device is a high voltage device having a reduced charge storage and a high mobility conduction channel, which enables the D-mode III-nitride device to conduct high current. As a result of reduced charge storage, the D-mode III-nitride device provides increased efficiency and operating frequency.

Low resistance switch 124, which can be a high voltage device, can be optimized to provide a very low on-state resistance. In one embodiment, low resistance switch 124 can comprise, for example, a silicon transistor coupled with a D-mode III-nitride device and a silicon diode, such as Schottky diode, coupled across the silicon transistor, as discussed above with respect to fast III-nitride switch 122. In another embodiment, low resistance switch 124 can comprise a Schottky diode coupled in series with a D-mode III-nitride device, which has a very low on-state resistance. In another embodiment, low resistance switch 124 can comprise a silicon diode, such as a Schottky diode.

Also shown in FIG. 1, a second terminal of inductor 126 is coupled to the anode of LED 130 at node 150, which forms an output of buck converter 112 and an output of voltage conversion circuit 100. Node 150 also provides output voltage (Vout) 152, which is a DC output voltage generated by buck converter 112. Further shown in FIG. 1, the cathode of LED 130 is coupled to the anode of 132, the cathode of LED 132 is coupled to the anode of LED 134, and the cathode of LED 134 is coupled to the feedback input of control circuit 120 and a first terminal of current sensor 128 at node 154. Each of LEDs 130, 132, and 134 can be, for example, a high-power LED, which can require a drive voltage of approximately 4.0 volts DC and a drive current of between approximately 150 milliamperes (mA) and approximately 1.5 amperes in an embodiment of the invention. Thus, to drive series-coupled LEDs 130, 132, and 134, Vout 152 can be approximately 12.0 volts DC. In an embodiment in which load 104 comprises one high-power LED, such as LED 130, 132, or 134, Vout 152 can be approximately 4.0 volts DC.

Further shown in FIG. 1, a second terminal of current sensor 128 is coupled to the negative output of full-bridge rectifier 108 at node 144. Current sensor 128 can comprise, for example, at least one resistor in an embodiment of the invention. Also shown in FIG. 1, control circuit 120 is coupled to respective third terminals (i.e. control terminals) of fast III-nitride switch 122 and low resistance switch 124 via control lines 156 and 158. In an embodiment in which low resistance switch 124 comprises a device without a designated control terminal, such as a diode, control line 158 is not utilized. Control circuit 120 can be configured to control the respective duty cycles of fast III-nitride switch 122 and low resistance switch 124 so to appropriately adjust output current 160 in response to a feedback signal provided at node 154.

The respective duty cycles of fast III-nitride switch 122 and low resistance switch 124 can be controlled by utilizing pulse width modulation (PWM) control signals, which can be provided on control lines 156 and 158. The duty cycle of fast III-nitride switch 122 can be an inverse of the duty cycle of low resistance switch 124. Thus, when fast III-nitride switch 122 is turned on, low resistance switch 124 is turned off, and vice versa. In one embodiment, fast III-nitride switch 122 can have a duty cycle of, for example, approximately 1.0 percent and low resistance switch 124 can have a duty cycle of approximately 99.0 percent.

Fast III-nitride switch 122 can be optimized to have a very high switching speed. As a result, buck converter 112 can achieve a ratio of input high voltage to output low voltage (i.e. a voltage conversion ratio) that is substantially greater than 10. In an embodiment of the invention, buck converter 112 can achieve a conversion ratio that is substantially greater than 20. In one embodiment, the conversion ratio of buck converter 112 can be at least 100. Thus, for example, buck converter 112 can converter an input voltage (i.e. Vin 146) of approximately 310.0 volts DC to an output voltage (i.e. Vout 152) of approximately 4.0 volts DC or less in an embodiment of the invention.

To achieve a high ratio of Vin 146 to Vout 152, low resistance switch 124 is necessarily turned on for a substantially longer duration than fast III-nitride switch 122. For example, low resistance switch 124 can be turned on for approximately 98.0 percent of the on-time of buck converter 112 in an embodiment of the invention. As a result, low resistance switch 124 can generate significantly more heat than fast III-switch 124. However, by optimizing low resistance switch 124 to have a very low on-time resistance, the amount of heat generated by it (i.e. low resistance switch 124) can be significantly reduced. Also, by reducing on-time resistance, the amount of energy consumed by low resistance switch 124 can be significantly reduced.

Thus, by utilizing fast III-nitride switch 122 and low resistance switch 124, an embodiment of the invention's buck converter can provide a ratio of input voltage to output voltage of 100 or higher. In contrast, a conventional buck converter that utilizes switches comprising high voltage silicon FETs, such as high voltage silicon MOSFETs, can have difficulty in achieving a voltage conversion ratio greater than approximately 10.0. Thus, an embodiment of the invention's buck converter can provide a substantially higher voltage conversion ratio compared to a conventional buck converter. As a result, an embodiment of the invention's buck converter can achieve a voltage conversion ratio that can require two or more conventional buck converter stages to achieve. Thus, for example, an embodiment of the invention's buck converter can advantageously reduce a high DC input voltage of approximately 310.0 volts to low DC output voltage of approximately 4.0 volts, which is sufficient to drive a single high-power LED.

Figure 2:
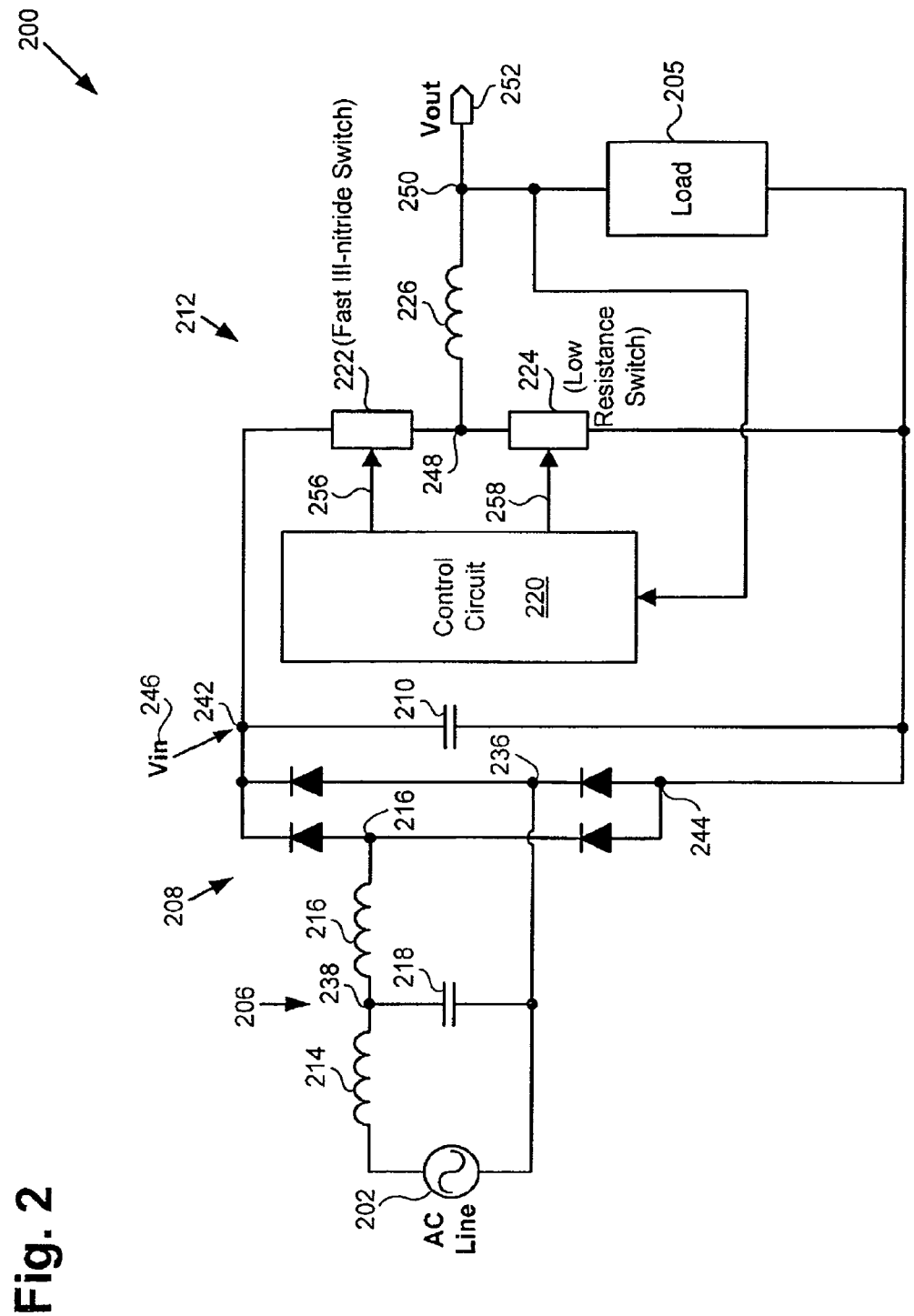
FIG. 2 illustrates a circuit diagram of an exemplary voltage conversion circuit including an exemplary buck converter in accordance with another embodiment of the present invention.

FIG. 2 shows a circuit diagram of an exemplary voltage conversion circuit coupled between an AC power source and a load in accordance with one embodiment of the present invention. In voltage conversion circuit 200 in FIG. 2, AC supply voltage 202, EMI filter 206, full-bridge rectifier 208, capacitors 210 and 218, inductors 214, 216, and 226, control circuit 220, fast III-nitride switch 222, low resistance switch 224, nodes 238, 240, 242, 244, 248, and 250, Vin 246, and Vout 252 correspond, respectively, to AC supply voltage 102, EMI filter 106, full-bridge rectifier 108, capacitors 110 and 118, inductors 114, 116, and 126, control circuit 120, fast III-nitride switch 122, low resistance switch 124, nodes 138, 140, 142, 144, 148, and 150, Vin 146, and Vout 152 in voltage conversion circuit 100 in FIG. 1. In voltage conversion circuit 100 in FIG. 1, buck converter 112 drives load 104, which can be a current driven load. In contrast, in voltage conversion circuit 200, buck converter 212 drives load 205, which can be a voltage driven load.

As shown in FIG. 2, load 205 is coupled between the output of buck converter 212 at node 250 and a negative output of full-bridge rectifier 208 at node 244 (i.e. ground). Load 205 can be, for example, a microprocessor, a digital signal processor (DSP), or other device that requires a low DC voltage. Also shown in FIG. 2, the feedback input of control circuit 200 is coupled to node 250. Thus, control circuit 220 can be configured to control the respective duty cycles of fast III-nitride switch 222 and low resistance switch 224 so to appropriately adjust the output voltage (i.e. Vout 252) in response to a feedback signal provided at node 250. An embodiment of the invention's buck converter 212 can provide similar advantages as an embodiment of the invention's buck converter 112 in voltage conversion circuit 100 in FIG. 1, such as a very high ratio of input-to-output voltage.

Figure 3:
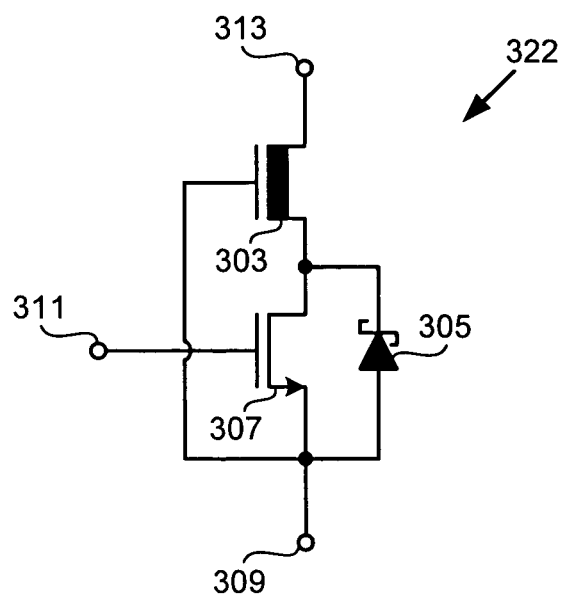
FIG. 3 illustrates a circuit diagram of an exemplary fast III-nitride switch in accordance with one embodiment of the present invention.

FIG. 3 shows a circuit diagram of an exemplary fast III-nitride switch in accordance with one embodiment of the present invention. In one embodiment of the present invention, fast III-nitride switch 322 in FIG. 3 can be optimized for a high switching speed and can be utilized for fast III-nitride switch 122 in FIG. 1 or fast III-nitride switch 222 in FIG. 2. In an embodiment of the invention, fast III-nitride switch 322 can also be utilized for low resistance switch 124 in FIG. 1 or for low resistance switch 224 in FIG. 2. However, when utilized for low resistance switch 124 or for low resistance switch 224, fast III-nitride switch 322 can be optimized to provide a low on-state resistance. Fast III-nitride switch 322 has terminals 309, 311, and 313 and includes silicon transistor 307, D-mode III-nitride device 303, and Schottky diode 305. Silicon transistor 307 can be, for example, a low voltage silicon FET, such as a low voltage silicon MOSFET. D-mode III-nitride device 303 can comprise a group III nitride compound semiconductor.

As shown in FIG. 3, silicon transistor 307 is coupled to D-mode III-nitride device 303 and Schottky diode 305 is coupled across silicon transistor 307. In particular, the anode of Schottky diode 305 is coupled to the source of silicon transistor 307 and the gate of D-mode III-nitride device 303 and the cathode of Schottky diode 305 is coupled to the drain of silicon transistor 307 and the source of D-mode III-nitride device 303. Schottky diode 305 can be a low voltage silicon Schottky diode in an embodiment of the present invention. In one embodiment, Schottky diode 305 can be integrated with silicon transistor 307.

Also shown in FIG. 3, the gate of D-mode III-nitride device 303, the source of silicon transistor 307 of fast III-nitride switch 322, and the anode of Schottky diode 305 are coupled to terminal 309 of fast III-nitride switch 322, the gate of silicon transistor 307 is coupled to terminal 311, and the drain of D-mode III-nitride device 303 is coupled to terminal 313 of fast III-nitride switch 322. Thus, for example, respective terminals 309, 311, and 313 of fast III-nitride switch 322 can be coupled to node 142, control line 156, and node 148 in FIG. 1 to replace fast III-nitride switch 122. In one embodiment, respective terminals 309, 311, and 313 of fast III-nitride switch 322 can be coupled to node 144, control line 158, and node 148 to replace low resistance switch 124 in FIG. 1.

D-mode III-nitride device 303 is a normally on device. However, by coupling silicon transistor 307 with D-mode III-nitride device 303 as discussed above, silicon transistor 307 causes D-mode III-nitride device 303 to operate in an enhancement mode (E-mode). For example, when silicon transistor 307 is turned on, D-mode III-nitride device 303 is also turned on, thereby allowing current to flow through silicon transistor 307 and D-mode III-nitride device 303. When silicon transistor 307 is turned off, D-mode III-nitride device 303 turns off as a result of a voltage that develops across silicon transistor 307. By including the combination of silicon transistor 307 and D-mode III-nitride device 303, fast III-nitride switch 322 provides reduced charge storage, thereby providing increased efficiency and increased operating frequency.

Schottky diode 305 also provides reduced charge storage, which provides increased efficiency and operating frequency. In addition, Schottky diode 305 provides reduced reverse recovery time (i.e. a faster reverse recovery). Thus, in an embodiment of the invention's buck converter, fast III-nitride switch 322 can provide a fast, high voltage switch having reduced charge storage, which provides increased efficiency and operating frequency, and also provides a faster reverse recovery time.

Figure 4:
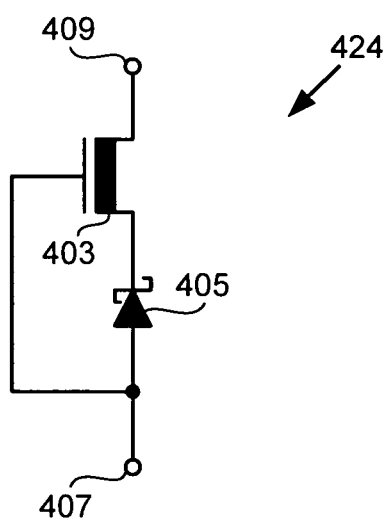
FIG. 4 illustrates a circuit diagram of an exemplary low resistance switch in accordance with one embodiment of the present invention.

FIG. 4 shows a circuit diagram of an exemplary low resistance switch in accordance with one embodiment of the present invention. In one embodiment of the present invention, low resistance switch 424 can be optimized for low on-state resistance and utilized for low resistance switch 124 in buck converter 112 in FIG. 1 or for low resistance switch 224 in buck converter 212 in FIG. 2. Low resistance switch 424 includes D-mode III-nitride device 403, which corresponds to D-mode III-nitride device 303 in FIG. 3, and Schottky diode 405, which corresponds to Schottky diode 305 in FIG. 3. Low resistance switch 424 has terminal 407, which is coupled to the anode of Schottky diode 405 and the gate of D-mode III-nitride device 403, and terminal 409, which is coupled to the drain of D-mode III-nitride device 403. In an embodiment of the invention, terminal 407 of low resistance switch 424 can be coupled to node 144 in FIG. 1 and terminal 409 of low resistance switch 424 can be coupled to node 148 to replace low resistance switch 124 in FIG. 1. In such embodiment, control line 158 is not utilized. In a similar manner, low resistance switch 424 can also replace low resistance switch 224 in FIG. 2 in an embodiment of the invention.

In low resistance switch 424, Schottky diode 405 is coupled in series with D-mode III-nitride device 403. In particular, the anode of Schottky diode 405 is coupled to the gate of D-mode III-nitride device 403 and the cathode of Schottky diode 405 is coupled to the source of D-mode III-nitride device 403. D-mode III-nitride device 403 is a normally on device. However, by coupling Schottky diode 405 in series with D-mode III-nitride device 403 as discussed above, Schottky diode 405 causes D-mode III-nitride device 403 to turn off when it (i.e. Schottky diode 405) is in a reverse mode (i.e. when current flows from cathode to anode).

For example, in a forward mode (i.e. when current flows from anode to cathode), Schottky diode 405 is turned on and D-mode III-nitride device 403 is also turned on. The voltage drop across Schottky diode 405 in the forward mode has a negligible effect on D-mode III-nitride device 403, which is a high voltage device. In the reverse mode, D-mode III-nitride device 403 turns off as a result of a voltage that develops across Schottky diode 405. Thus, the combination of Schottky diode 405 and D-mode III-nitride device 403 can operate as a high voltage diode, where the anode of Schottky diode 405 and the gate of D-mode III-nitride device 403 can be an "anode" of the high voltage diode and the drain of D-mode III-nitride device 403 can be a "cathode" of the high voltage diode. By including the series-coupled combination of Schottky diode 405 and D-mode III-nitride device 403, low resistance switch 424 provides a very low on-state resistance and reduced charge storage, thereby providing increased efficiency and increased operating frequency.

Thus, as discussed above, in the embodiments in FIGS. 1 and 2, the invention provides a buck converter including a fast III-nitride switch, which is optimized for high switching speed, and a low resistance switch, which is optimized for low on-state resistance. As a result, the invention provides a buck converter having a substantially higher input high voltage to output low voltage ratio compared to a conventional buck converter utilizing high voltage silicon transistors, such as high voltage silicon FETs or MOSFETs. In one embodiment, the invention's buck converter can provide a voltage conversion ratio of, for example, at least 100.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A buck converter for converting a high voltage at an input of said buck converter to a low voltage at an output of said buck converter, said buck converter comprising:
   a fast III-nitride switch interposed between said input and said output and a low resistance switch interposed between said output and a ground, wherein said fast III-nitride switch and said low resistance switch form a half-bridge directly coupled between said input of said buck converter and said ground;
   wherein said fast III-nitride switch comprises a first depletion-mode (D-mode) III-nitride device coupled to a silicon transistor and a first diode coupled across said silicon transistor;
   wherein said low resistance switch comprises a second D-mode III-nitride device coupled in series with a second diode;
   a control circuit configured to control a duty cycle of said fast III-nitride switch in response to a feedback signal from said output;
   said low resistance switch having a low on-state resistance and reduced charge storage;
   said fast III-nitride switch having a sufficiently high switching speed so as to allow a ratio of said input high voltage to said output low voltage to be approximately 100 or higher.

2. The buck converter of claim 1, wherein said first diode comprises a Schottky diode.

3. The buck converter of claim 2, wherein said first D-mode III-nitride device is a GaN device.

4. The buck converter of claim 2, wherein an anode of said Schottky diode is coupled to a source of said silicon transistor and a cathode of said Schottky diode is coupled to a drain of said silicon transistor.

5. The buck converter of claim 1, wherein said second diode comprises a Schottky diode.

6. The buck converter of claim 5, wherein said second D-mode III-nitride device is a GaN device.

7. The buck converter of claim 1 further comprising a buck inductor coupled between said fast III-nitride switch and said output of said buck converter.

8. A voltage conversion circuit including a buck converter for converting a high voltage at an input of said buck converter to a low voltage at an output of said buck converter, said input of said buck converter being coupled to a full-bridge rectifier, said buck converter comprising:
   a fast III-nitride switch interposed between said input and said output of said buck converter and a low resistance switch interposed between said output of said buck converter and said full-bridge rectifier, wherein said fast III-nitride switch and said low resistance switch form a half-bridge directly coupled between said input of said buck converter and said full-bridge rectifier;
   wherein said fast III-nitride switch comprises a first depletion-mode (D-mode) III-nitride device coupled to a silicon transistor and a first diode coupled across said silicon transistor;
   wherein said low resistance switch comprises a second D-mode III-nitride device coupled in series with a second diode;
   a control circuit configured to control a duty cycle of said fast III-nitride switch in response to a feedback signal from said output;
   said low resistance switch having a low on-state resistance and reduced charge storage;
   said fast III-nitride switch having a sufficiently high switching speed so as to allow a ratio of said input high voltage to said output low voltage to be approximately 100 or higher.

9. The voltage conversion circuit of claim 8, wherein a load is coupled between said output of said buck converter and said full-bridge rectifier.

10. The voltage conversion circuit of claim 9, wherein said load comprises at least one high-power LED.

11. The voltage conversion circuit of claim 9, wherein said buck converter further comprises a current sensor coupled between said load and said full-bridge rectifier.

12. The voltage conversion circuit of claim 8, wherein said first diode comprises a Schottky diode.

13. The voltage conversion circuit of claim 8, wherein said second diode comprises a Schottky diode.

14. The voltage conversion circuit of claim 8 further comprising an electromagnetic interference filter coupled to AC inputs of said full-bridge rectifier.

15. The voltage conversion circuit of claim 8, wherein said buck converter further comprises a buck inductor coupled between said fast III-nitride switch and said output of said buck converter.

* * * * *